United States Patent
Gamand

(10) Patent No.: US 7,534,639 B2
(45) Date of Patent: May 19, 2009

(54) SEMICONDUCTOR DEVICE WITH A RESONATOR

(75) Inventor: Patrice Gamand, Douvres la Delivrande (FR)

(73) Assignee: NXP B.V., Eindhoven (NL)

( * ) Notice: Subject to any disclaimer, the term of this patent is extended or adjusted under 35 U.S.C. 154(b) by 410 days.

(21) Appl. No.: 10/578,645

(22) PCT Filed: Nov. 1, 2004

(86) PCT No.: PCT/IB2004/003617

§ 371 (c)(1),
(2), (4) Date: May 9, 2006

(87) PCT Pub. No.: WO2005/048450

PCT Pub. Date: May 26, 2005

(65) Prior Publication Data

US 2007/0134838 A1   Jun. 14, 2007

(30) Foreign Application Priority Data

Nov. 14, 2003  (EP)  ................... 03300216

(51) Int. Cl.
*B81B 1/00*  (2006.01)
(52) U.S. Cl. .................. 438/48; 257/414; 257/E21.519
(58) Field of Classification Search ................ 257/118, 257/244, 328–333, 466, 513, 594, 107–108, 257/252, 254, 414–416, 618–619, E21.001, 257/E21.002, E21.459, E21.476, E21.481, 257/E21.518, E29.324; 438/242, 268–274, 438/48, 50, 52
See application file for complete search history.

(56) References Cited

U.S. PATENT DOCUMENTS

| | | | | |
|---|---|---|---|---|
| 5,369,381 A | * | 11/1994 | Gamand | 333/161 |
| 6,136,630 A | * | 10/2000 | Weigold et al. | 438/50 |
| 6,154,305 A | * | 11/2000 | Dickensheets et al. | 438/24 |
| 6,257,739 B1 | * | 7/2001 | Sun et al. | 362/285 |
| 6,710,681 B2 | * | 3/2004 | Figueredo et al. | 333/187 |
| 6,756,247 B1 | * | 6/2004 | Davis et al. | 438/52 |
| 6,812,056 B2 | * | 11/2004 | Blanchard | 438/50 |
| 6,852,561 B2 | * | 2/2005 | Bidard et al. | 438/50 |
| 6,913,941 B2 | * | 7/2005 | O'Brien et al. | 438/48 |
| 7,312,553 B2 | * | 12/2007 | Laermer | 310/312 |
| 2002/0145489 A1 | * | 10/2002 | Cornett et al. | 333/197 |
| 2003/0048036 A1 | * | 3/2003 | Lemkin | 310/309 |
| 2004/0048410 A1 | * | 3/2004 | O'Brien et al. | 438/52 |
| 2004/0116157 A1 | * | 6/2004 | Vance et al. | 455/562.1 |
| 2004/0147055 A1 | * | 7/2004 | Brosnihan et al. | 438/50 |
| 2004/0164371 A1 | * | 8/2004 | Kang | 257/467 |
| 2004/0175855 A1 | * | 9/2004 | Blanchard | 438/48 |
| 2004/0209435 A1 | * | 10/2004 | Partridge et al. | 438/381 |
| 2004/0245586 A1 | * | 12/2004 | Partridge et al. | 257/414 |
| 2006/0223215 A1 | * | 10/2006 | Blanchard | 438/50 |

* cited by examiner

*Primary Examiner*—W. David Coleman
*Assistant Examiner*—Maliheh Malek

(57) ABSTRACT

The present invention relates to a method of manufacturing a resonator within a semiconductor device, said semiconductor device comprising a substrate, wherein said method comprises the steps of: etching a hole in the substrate, creating a first doping zone (Z-DIFF1) for defining a first electrode, partitioning said first electrode into two electrodes, applying a delimited oxide deposit inside and around the hole, defining a second doping zone (Z-DIFF2) totally covering the hole, removing the oxide deposit in order to define an element forming the resonator able to vibrate between the two electrodes.

11 Claims, 9 Drawing Sheets

SEMICONDUCTOR DEVICE WITH A RESONATOR

FIELD OF THE INVENTION

The present invention relates to a method of manufacturing a resonator within a semiconductor device, said semiconductor device comprising a substrate. The present invention also relates to said semiconductor device.

Such a method may be used in, for example, the manufacture of a RF transceiver.

BACKGROUND OF THE INVENTION

A method of manufacturing a resonator within a semiconductor device is described in US patent application US 2002/0145489. Such a resonator provides an integrated oscillator with a very high Q factor that is needed to generate a stable frequency for the systems comprising a semiconductor device such as RF transceivers. Such a resonator is usually called Micro Electromechanical Device or MEM. Such a MEM is intended to replace discrete Quartz oscillators, which are costly devices and which cannot be integrated within a semiconductor device. The semiconductor is based on an SOI (Silicon on Insulator) wafer comprising a substrate. An SOI wafer comprises an insulating layer generally made of oxide. The method of manufacturing such a resonator comprises the steps of:
  defining a first layer born on the substrate,
  defining a second layer born on the substrate,
  etching the second layer to define an element capable of resonating in a vibrational mode, the element being approximated to a trench.

The oxide layer renders it possible to stop the etching adequately and to avoid a coupling with the substrate, that is to say a leakage current. As is shown in FIG. 33 of said prior art, the element is attached to the substrate at its bottom.

A first drawback of such a method is that it needs a specific complicated processing step after the realization of the resonator to make it hermetic. Indeed, usually, at least one protective oxide layer and at least one metallization layer covers the whole substrate. In the prior art described, there is a need to define additional cap layers in order to prevent the element being cast into the metallization and oxide layers.

A second drawback is that the etching cannot be deep because it is stopped by the oxide insulating layer, such a layer being not deeply integrated inside the substrate of the wafer, from 0.5 to 2 microns, which is a limitation in this SOI technology.

Finally, it is a costly solution because it uses SOI wafers, which are known to be more expensive than conventional semiconductor wafers.

SUMMARY OF THE INVENTION

Accordingly, it is an object of the invention to provide a method of manufacturing a resonator within a semiconductor device, which renders it possible to manufacture a resonator within a hermetically sealed semiconductor device in a simple manner without the use of an SOI wafer.

To this end, a method of manufacturing a resonator within a semiconductor device is provided, said semiconductor device comprising a substrate with a first axis and a second axis which are perpendicular, wherein said method comprises the steps of:
  etching a hole in the substrate,
  creating a first doping zone for defining a first electrode,
  partitioning said first electrode into two electrodes,
  applying a delimited oxide deposit inside and around the hole according to a specific deposit pattern,
  defining a second doping zone fully covering the hole,
  removing the oxide deposit in order to define an element forming the resonator able to vibrate between the two electrodes.

In addition, there is provided a semiconductor device comprising a substrate with a first doping zone, two perpendicular axes, a second doping zone in contact with the first doping zone, and a resonator, said resonator being represented by an element with two parts able to vibrate between two electrodes made of the first doping zone, the first part of said element being held substantially planar to the substrate surface by means of the second doping zone and the second part of said element being substantially perpendicular to the substrate surface and free to move.

As we will see in detail further on, the oxide zone used in the method renders it possible to obtain an element able to vibrate between two electrodes, said element being in a hole, whereas the second doping layer covers the hole so as to seal off the resonator hermetically and at the same time to keep one part of the element attached to the surface of the substrate.

Preferably, in a non-limited embodiment, said hole is a trench or a pore which is substantially perpendicular to the surface of the substrate.

Advantageously, the substrate is of a high-ohmic type and the first doping zone is of a low-ohmic type.

Preferably, in a non-limited embodiment, the partitioning of the two electrodes is obtained by means of a partitioning pattern enabling an Argon or Boron or ion implant.

Advantageously, the implant partly covers the hole at its bottom and sides and the substrate's surface adjoining said hole.

Advantageously, the specific deposit pattern extends along the second axis, the inside of said deposit pattern allowing the oxide to be settled inside the entire hole and at the substrate surface adjoining said hole, and beyond.

Advantageously, the second doping zone is obtained by means of a second doping pattern extending along the first axis of the semiconductor, the inside of said pattern allowing a second dopant to be settled totally inside the hole.

Advantageously, the inside of the second doping pattern permits a second dopant to cover totally the oxide deposit adjoining the hole and beyond.

Preferably, in a non-limited embodiment, said method comprises a further step of adding first pads along the second axis on both sides of the hole, said pads being in contact with the first doping zone.

Preferably, in a non-limited embodiment, said method comprises a further step of adding second pads along the first axis on both sides of the hole, said pads being in contact with the second doping zone.

BRIEF DESCRIPTION OF THE DRAWINGS

Additional objects, features and advantages of the invention will become apparent upon reading the following detailed description and upon reference to the accompanying drawings in which.

DETAILED DESCRIPTION OF THE INVENTION

In the following description, functions or constructions familiar to those skilled in the art are not described in detail since they would immerse the invention in unnecessary detail.

Figure 1:
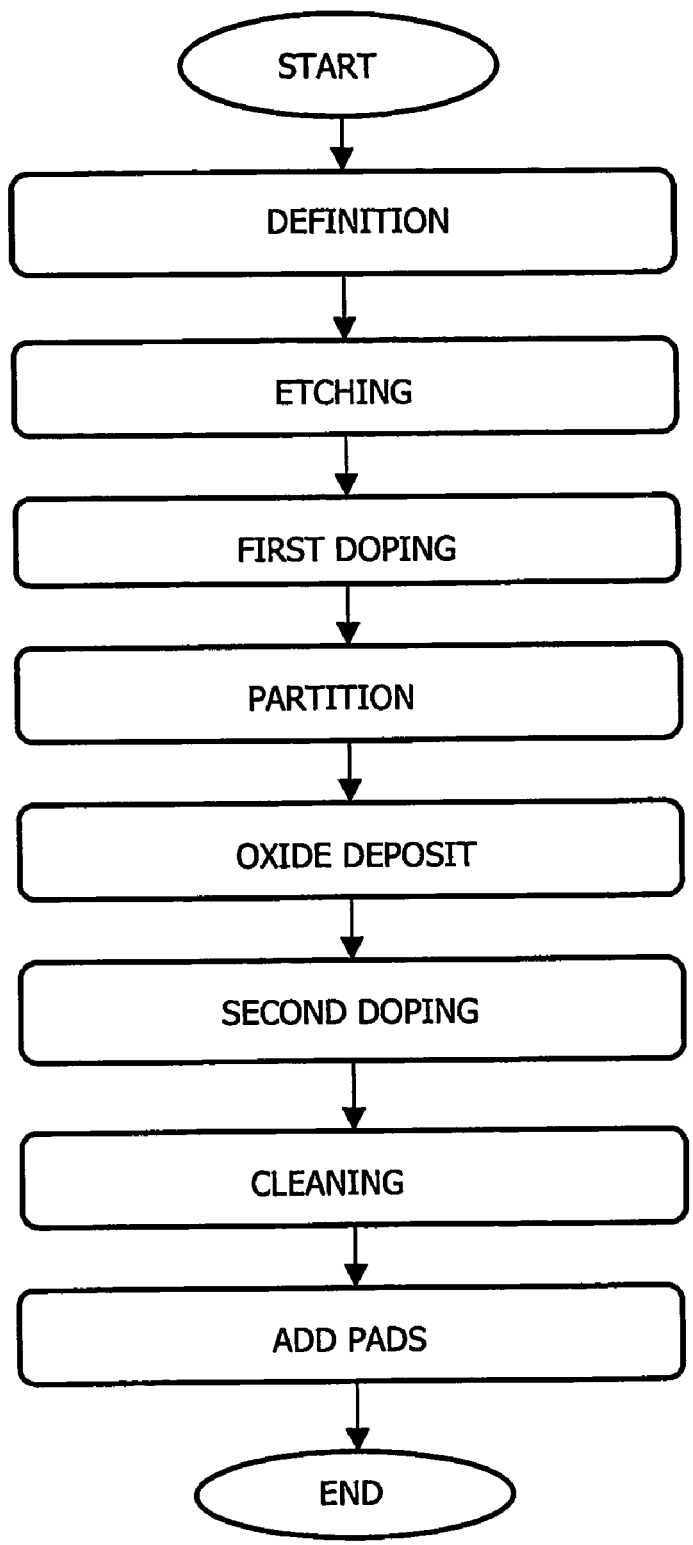
FIG. 1 is a flow chart of the method of manufacturing a resonator within a semiconductor according to the invention.

The present invention relates to a method of manufacturing a resonator within a semiconductor device SI. Said semiconductor device SI comprises a substrate Z_HO. Said substrate is made of silicon. A flow chart of said method is shown in FIG. 1 and the semiconductor device SI is illustrated in FIG. 2.

The substrate Z_HO is a high-ohmic substrate, its resistivity being preferably greater than 10 Ohm·cm, so that it presents a high resistivity. The semiconductor device SI comprises two axes XX' and YY' that are perpendicular to each other and that are planar to the surface of said semiconductor device SI.

Figure 2:
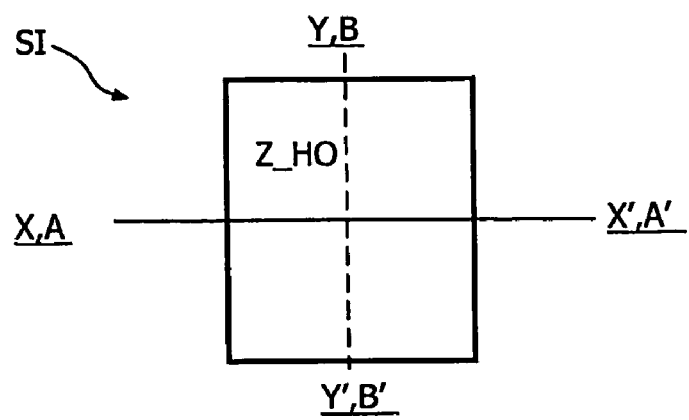
FIG. 2 depicts a semiconductor used for making a resonator according to the method of FIG. 1.
Figure 4:
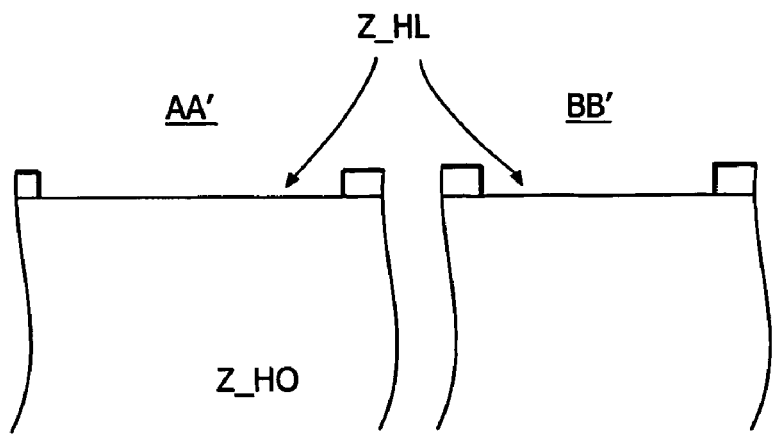
FIG. 4 depicts two sectional views of the semiconductor device of FIG. 2 after a pattern definition step.

For the following description two sectional views, represented in FIG. 4, will be used, a first one AA' taken on the first axis XX' and a second one BB' on the axis YY' as shown in FIG. 2.

In order to manufacture a resonator within said semiconductor device SI, the following steps are performed.

In a first step DEFINITION, a first definition zone Z_HL is defined on the semiconductor device SI by means of a first pattern M_HL called definition pattern. The resonator will be built in this definition zone Z_HL. The definition pattern M_HL serves as an isolation layer to protect the area outside the resonator device during the next process step.

Figure 3:
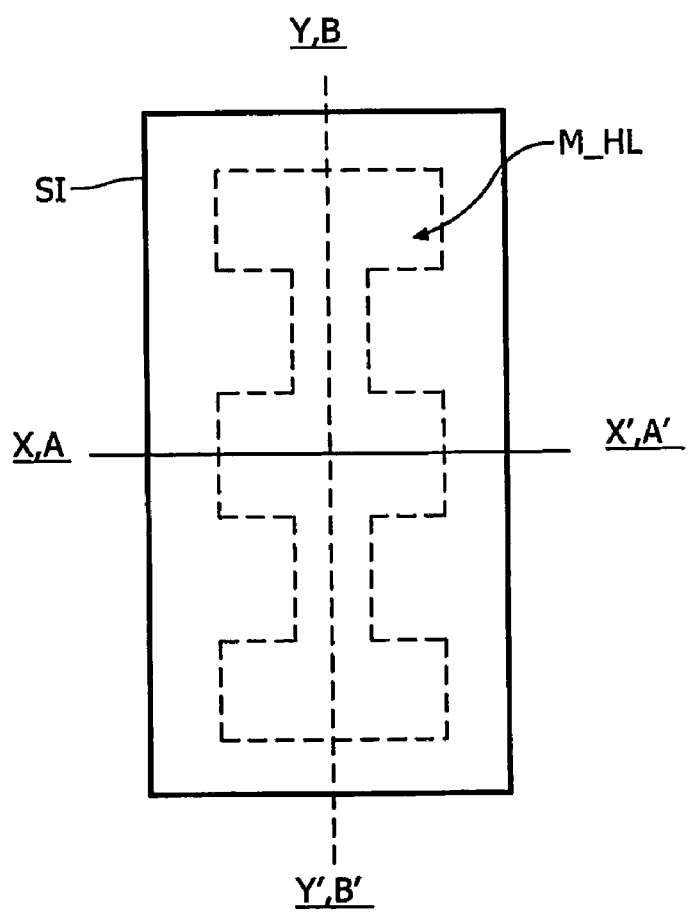
FIG. 3 illustrates a definition pattern applied on the semiconductor device of FIG. 2.

To this end, the first pattern M_L is applied on the substrate of the semiconductor device SI, the inside of the pattern being open and being the definition zone Z_HL and the outside being a plain mask, said first pattern partly covering the substrate of the semiconductor device SI. This first pattern M_HL extends along the second axis BB' as shown in FIG. 3.

Usually, a physical mask that represents a specific pattern is made of borosilicate. Two different methods are used, depending on whether a resin or an oxide is to be deposited on the substrate.

If a resin is applied on the substrate, the following method is used:

the resin is applied on the substrate, the mask is applied, the whole substrate is exposed to UV, the resin layer, which is a photo-resist that is suited to UV or X-ray exposure, polymerizes under said exposure where it is not masked, the resin is developed, some metallization layers are provided and etching is performed on the substrate, and the resin is removed with a solvent.

It is to be noted that, when a resin is developed, the whole substrate is dipped into a developer product known to those skilled in the art. Said product dissolves the zones where the resin has polymerized. Thus, the substrate comprises two kinds of zones: some stripped zones and some protected zones.

If an oxide is applied, the following method is used:

the oxide is applied on the entire surface of the substrate, a resin is applied on the oxide and the mask is applied, the entire substrate is exposed to UV, the resin layer is developed after polymerization, such that some oxide zones are stripped, the stripped oxide zones are etched (ion etching) so that the oxide in these zones is removed, the resin is removed with a solvent: the substrate thus has some zones covered with oxide representing a pattern identical to the mask applied, and finally, some doping or etching may be performed, and then the remaining oxide can be removed by etching.

It is to be noted that this second method, also called hard mask, is used, for example, whenever a resin is not firm enough to withstand a step of deep etching.

Figure 5:
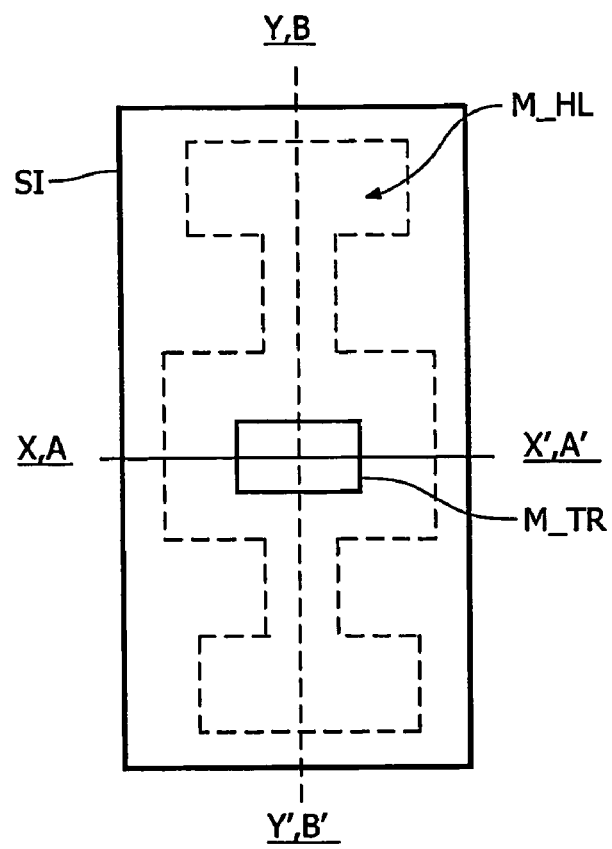
FIG. 5 illustrates an etching pattern applied on the semiconductor device of FIG. 3.

In a second step ETCHTING, a hole TR is provided inside the substrate of the semiconductor device SI by means of a second pattern M_TR. As illustrated in FIG. 5, the second pattern M_TR (a rectangle in a continuous line) is smaller than the first pattern M_HL and is applied inside the outlines of the first pattern M_HL, so that the hole TR is made inside the definition zone Z_HL.

The hole is a trench of a pore. The hole is substantially perpendicular to the surface of the substrate, as shown in FIG. 6 in the sectional view BB'.

In a third step FIRST DOPING, a first doping is provided on the substrate inside the definition zone Z_HL to give it a low access resistance, so that a conductive area or first doping zone Z_DIFF1 that forms an electrode is defined. This first doping zone Z_DIFF1 is low-ohmic with a resistivity preferably below 0.5 Ohm.cm. Thus, a part of the definition zone has become a low-ohmic zone after this first doping step.

Figure 6:
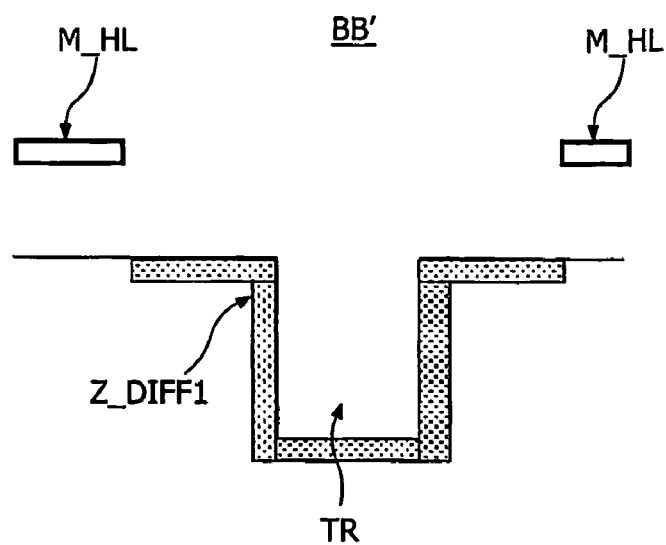
FIG. 6 depicts a sectional view of the semiconductor of FIG. 4 after an etching step and a first doping step.

The first doping zone Z_DIFF1 is represented by the dotted areas shown in the sectional view BB' of FIG. 6.

The doping is performed with a dopant of N+ ions, for example. Thus, the first doping zone Z_DIFF1 forms a crystalline network made of N+ ions.

The definition pattern M_HL, which is a hard mask, is then removed.

Figure 7:
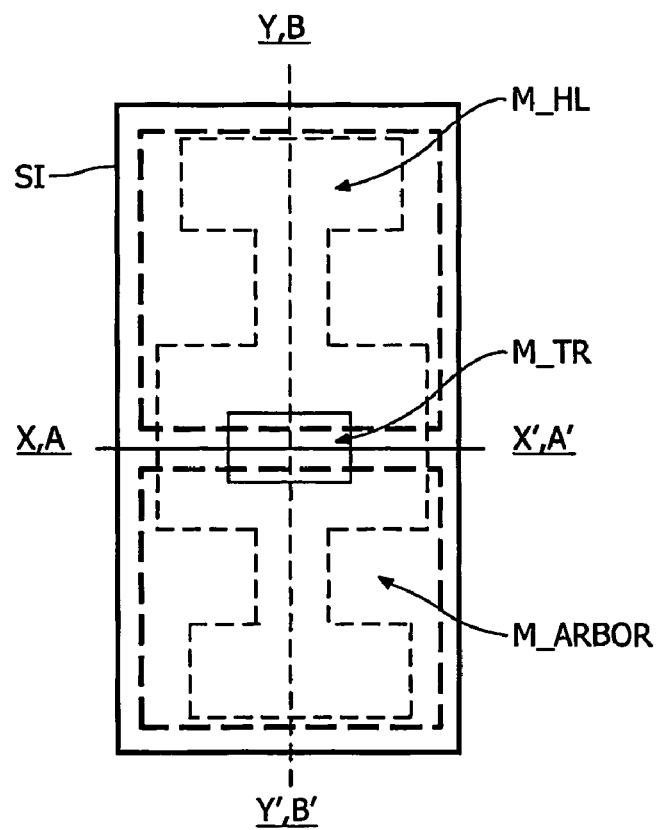
FIG. 7 illustrates a partitioning pattern applied on the semiconductor device of FIG. 5.

In a fourth step PARTITION, the conductive area Z_DIFF1 is partitioned in order to have two distinct conductive areas. To this end, a third pattern M_ARBOR is used in order to apply a dopant that is highly resistive inside the hole TR. The dopant is preferably made of Boron or Argon AR. As shown in the planar view of FIG. 7, the third pattern M_ARBOR is represented by two squares in continuous lines, the inside of the squares being plain. This pattern M_ARBOR extends along the second axis YY'.

Figure 8:
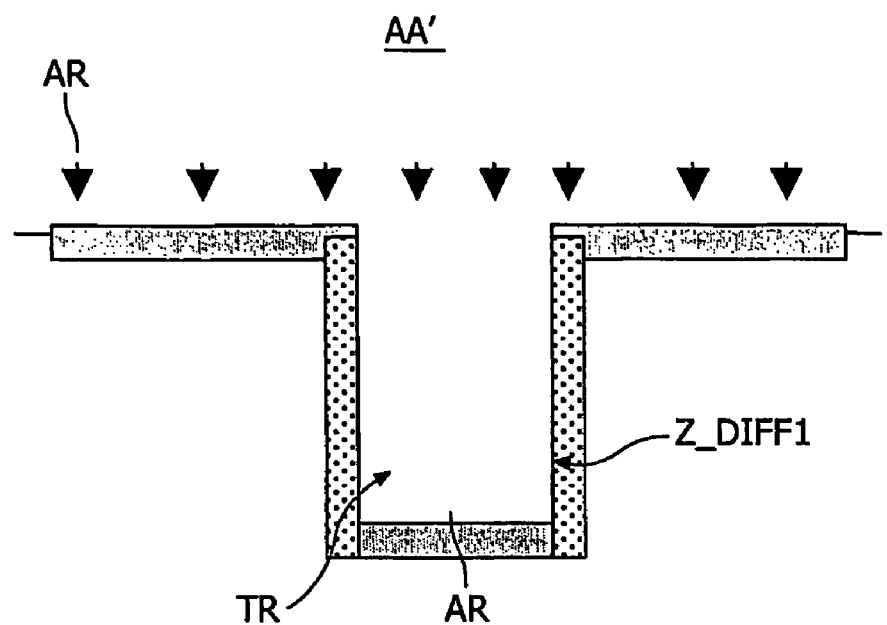
FIG. 8 depicts two sectional views of the semiconductor of FIG. 6 after a partitioning step.
Figure 8:
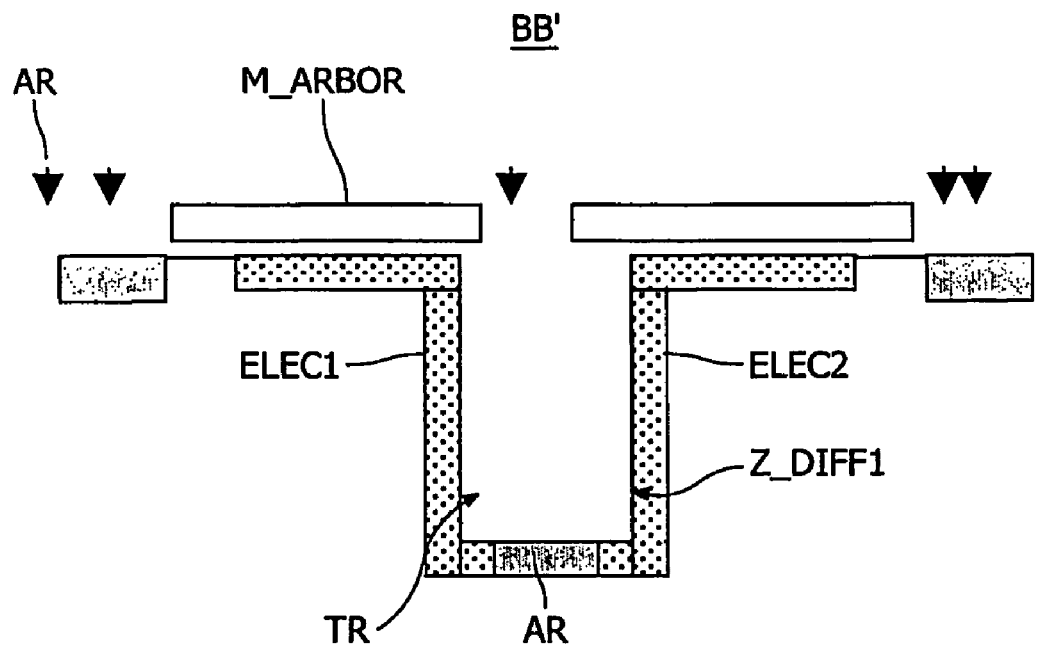

The arrows in the sectional views AA' or BB' of FIG. 8 show the areas where Boron or Argon is to be implanted. The grey areas show where there is effectively an implant of Boron or Argon. The implant is carried out over the entire surface of the semiconductor device SI, except for the surface hidden by the third pattern M_ARBOR. It partly covers the outlines and the bottom of the hole. The pattern M_ARBOR is such that it allows the Argon to settle partly inside the bottom and on the sides of the hole TR and partly at the surface of the substrate in the neighborhood of said hole TR.

In more detail, in the first sectional view AA', outside the hole TR at the surface of the substrate, one can see that the Argon has settled at the surface of the substrate and totally covers the substrate adjoining the hole TR, whereas in the second sectional view BB', outside the hole TR at the surface of the substrate, the dopant AR has not settled on the first doping zone Z_DIFF1 but next to this zone, directly on the substrate Z_HO.

Thus the deposit of the highly resistive dopant defines two distinct conductive areas inside the hole made of the first dopant Z_DIFF1, which form two electrodes ELECT1 and ELECT2 as illustrated in FIG. 8. Indeed, the Argon or Boron implant in the bottom of the hole TR breaks the atomic links of the crystalline network. Thus, the conductivity of the silicon that was doped with N+ ions is eliminated in this location.

After the Argon deposit, the third pattern M_ARBOR is removed from the substrate by etching as described above in the mask description.

In a fifth step OXIDE DEPOSIT, a delimited oxide deposit Z_OXI is provided on the substrate of the semiconductor device SI, said oxide deposit being used in a later stage to define an element that represents the resonator, as will be described below.

Figure 9:
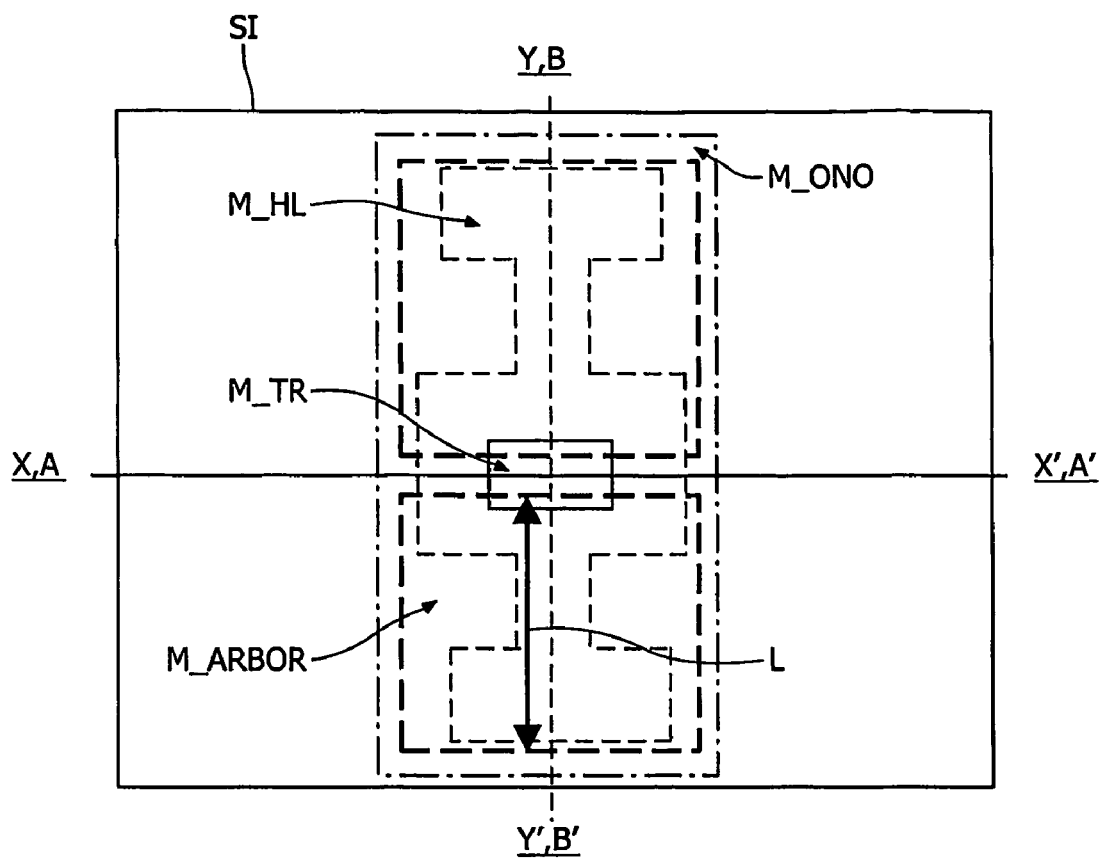
FIG. 9 illustrates a delimited oxide deposit pattern applied on the semiconductor device of FIG. 7.

To this end, a fourth specific delimited pattern M_ONO is applied on the substrate of the semiconductor device SI. This fourth pattern is shown in FIG. 9 in dash-dot lines and extends along the second axis YY'. It totally covers the former locations of the first M_HL, second M_TR, and third patterns M_ARBOR. The inside of said oxide deposit pattern M_ONO represents the openings that allow the oxide to be deposited, the outside being the plain mask.

The pattern is such that it allows the oxide to settle inside the entire hole TR and at the surface of the substrate adjoining the hole TR and beyond, so that it entirely covers the low-ohmic zone Z_HL.

Figure 10:
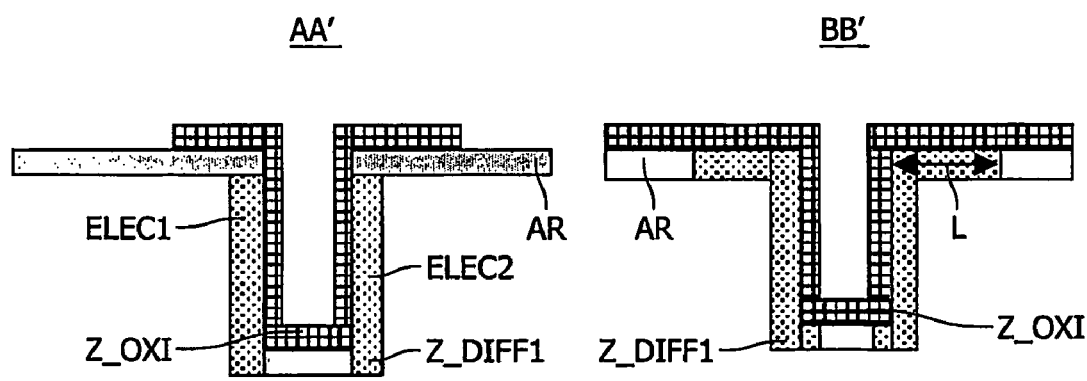
FIG. 10 depicts two sectional views of the semiconductor device of FIG. 8 after an oxide deposit step.

The oxide deposit Z_OXI is illustrated in detail in the sectional views AA' and BB' of FIG. 10 and is represented by the squared areas. As can be seen, the oxide Z_OXI has settled at the bottom and on the sides inside the hole TR.

Moreover, as can be seen in the first sectional view AA', outside the hole TR at the surface of the substrate, the oxide has settled on the argon implant in the neighborhood of the hole TR. In the second sectional view BB', outside the hole TR at the surface of the substrate, the oxide Z_OXI totally covers the first doping zone Z_DIFF1 adjoining the hole TR and covers the Argon implant adjoining this part of the first doping zone Z_DIFF1.

In a sixth step SECOND DOPING, a second doping with a second dopant is performed.

Figure 11:
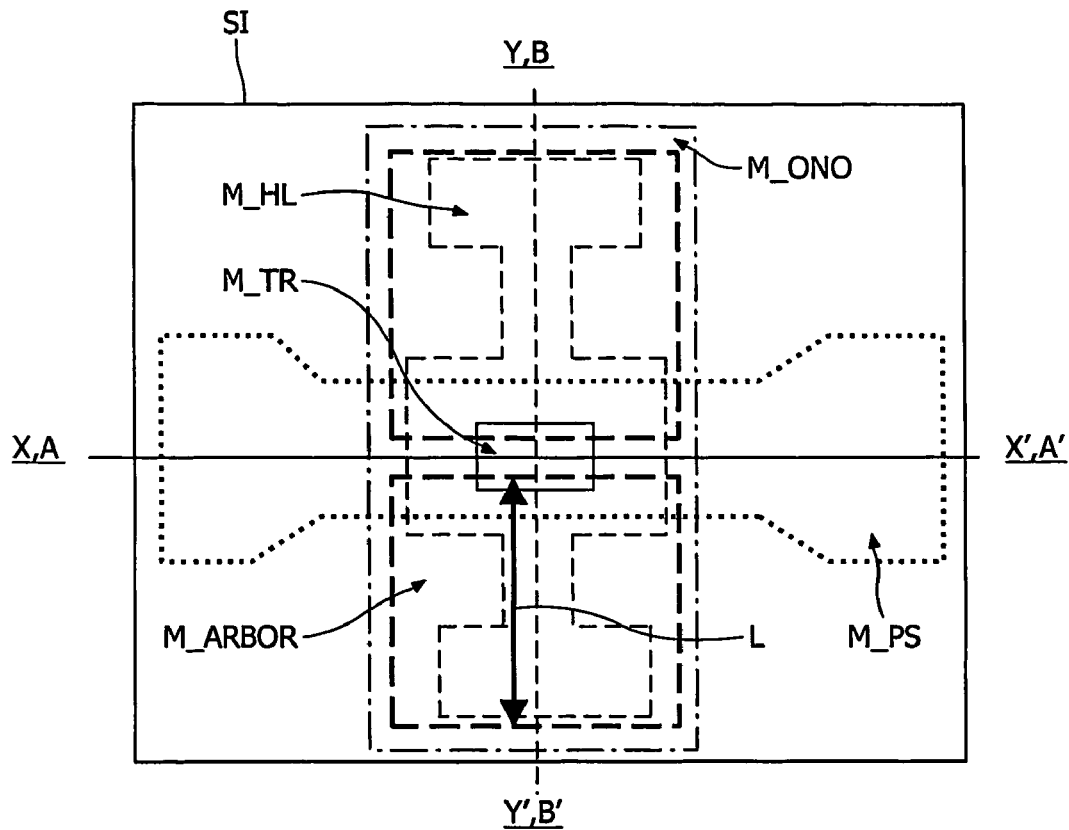
FIG. 11 illustrates a doping pattern applied on the semiconductor device of FIG. 9.

To this end, a fifth pattern M_PS is applied on the substrate of the semiconductor device SI. This fifth pattern M_PS is illustrated in FIG. 11 in dotted lines. It extends along the first axis XX' of the semiconductor device SI so that it totally covers the former location of the second pattern M_TR and partly covers the other former locations of the first M_HL, third M_ARBOR, and fourth patterns M_ONO. The outside of the pattern M_PS represents the plain mask and the inside represents the openings that allow the second dopant, for example P+ ions, to be implanted.

Figure 14:
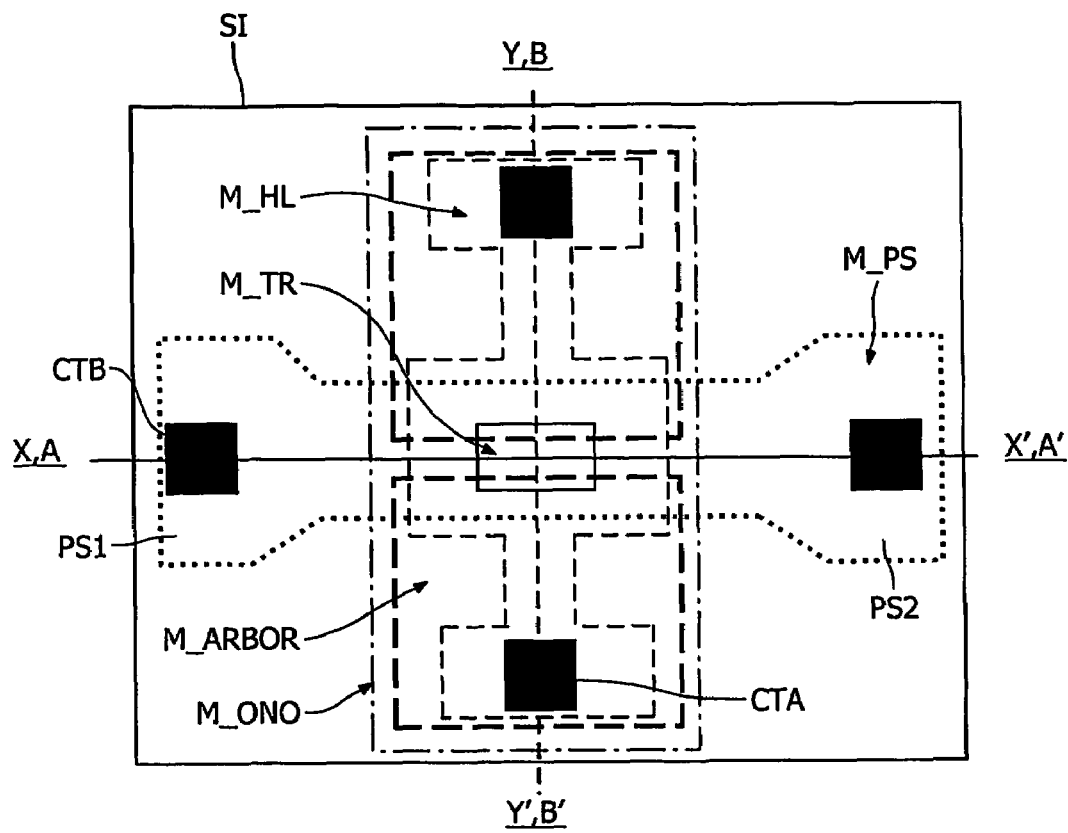
FIG. 14 is a plan view of the semiconductor device of FIG. 11 with some added contacts.

As can be seen in FIG. 14, this second doping pattern M_PS leaves two openings PS1 and PS2 that do not cover the former locations of the other patterns, so that some pads may be added later on in the locations of these two openings PS1 and PS2.

Figure 12:
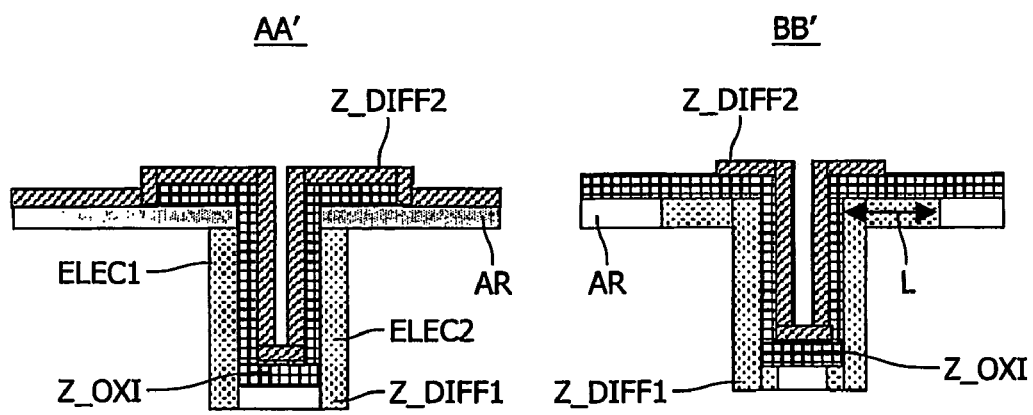
FIG. 12 depicts two sectional views of the semiconductor device of FIG. 10 after a second doping step.

The dopant deposit Z_DIFF2 is illustrated in detail in the sectional views AA' and BB' of FIG. 12 and is represented by the hatched areas. As can be seen, this second dopant Z_DIFF2 has settled at the bottom and on the sides inside the hole TR.

Moreover, as can be seen in the first sectional view AA', outside the hole TR at the surface of the substrate, the second dopant Z_DIFF2 totally covers the oxide deposit Z_OXI adjoining the hole TR and covers the Argon implant next to this oxide deposit part. In the second sectional view BB', outside the hole TR at the surface of the substrate, the dopant Z_DIFF2 partly covers the oxide zone Z_OXI adjoining the hole TR.

Of course, the second dopant for the second doping zone Z_DIFF2 may alternatively be made of N+ ions. In this case, the first dopant for the first doping zone Z_DIFF1 is made of P+ ions.

Figure 13:
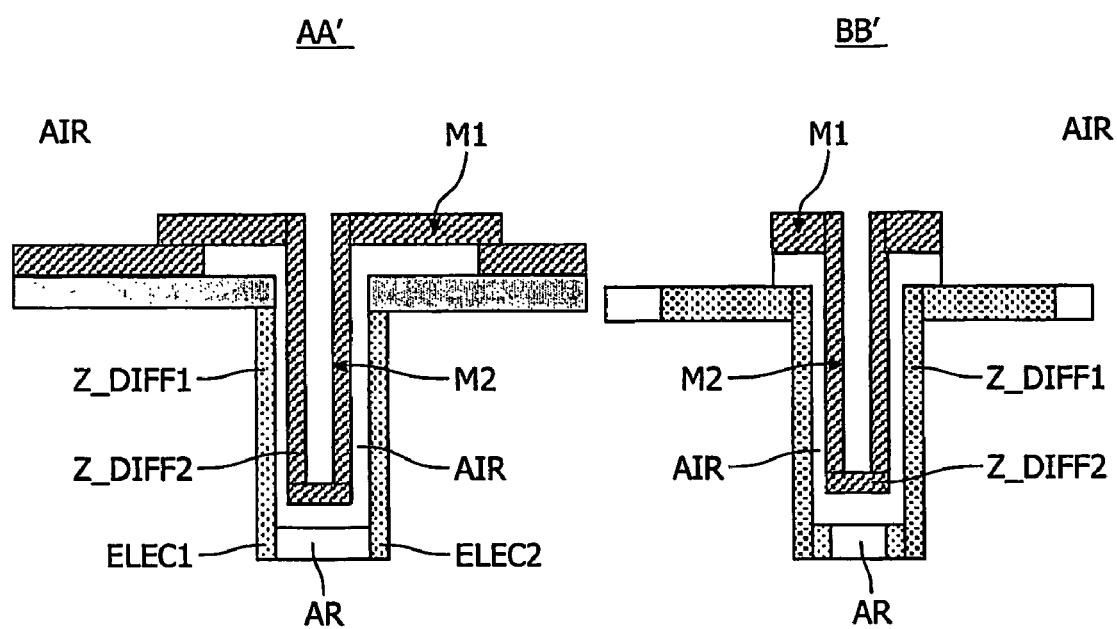
FIG. 13 depicts two sectional views of the semiconductor device of FIG. 12 after a cleaning step.

In a seventh step CLEANING, the oxide deposit is removed in order to define the element, said element being capable of vibrating between the two electrodes defined in the fourth step, and thus representing the resonator. The cleaning is performed with a solution of hydrofluoric HF acid, for example. Thus, there is now some air AIR at the location of the oxide, as shown in FIG. 13.

As shown in the sectional views AA' and BB' of the semiconductor device SI, said element comprises two parts, the first part M1 of said element being held substantially planar to the surface of the substrate and the second part M2 of said element being substantially perpendicular to the surface of the substrate and capable of movement. The first part M1 is attached to the surface by means of the second doping zone Z_DIFF2 as can be seen on the first sectional view AA'. As can be also observed in the second sectional view BB', the second part M2 that is vertical is freely movable, so that the element can readily vibrate between the two electrodes ELEC1 and ELEC2 when these electrodes are excited by a current, the element being made of the second doping zone Z_DIFF2.

It is to be noted that this second doping zone Z_DIFF2 seals off the resonator hermetically, and therefore the substrate of the semiconductor device SI, as it extends beyond the hole TR where the element is located as described above, and beyond the oxide deposit adjoining the hole TR as shown in the first sectional view AA'.

In an additional step ADD PADS, first pads CTA are added in order to be able to apply a current for making the element vibrate as shown in FIG. 14. Hence, electrical access is provided to the resonator. Two first pads CTA are added along the second axis YY', which pads are in contact with the first doping zone Z_DIFF1 shown in the second sectional view BB' of FIG. 15. The two contacts are arranged on each side of the hole TR.

Thus, in order to start a vibration, alternative AC and direct DC voltages are applied to these two pads CTA. A capacitive coupling is obtained, as the two electrodes ELEC1 and ELEC2 are fed by the AC and DC voltages, and a current can easily circulate through the low-resistive electrodes made from the first doping zone Z_DIFF1.

In response, the element inside the hole TR will mechanically vibrate as it is made of a second dopant Z_DIFF2, which is opposed to $Z_{DIFF1}$ of which the two electrodes are made.

When the signal frequency of the AC voltage matches the vibration, the resonator will resonate.

Finally, in order to recover the vibration of the element, two other pads CTB are added along the first axis XX', which pads are in contact with the second doping zone Z_DIFF2 that neighbors the first part M1 of the element as illustrated in the first sectional view AA'. The two contacts CTB are arranged on each side of the hole TR.

More specifically, these pads CTB are connected at the locations of the two openings PS1 and PS2 of the fourth pattern M_PS used as illustrated in FIG. 14. An AC signal can be detected at these second two pads CTB via an amplifier (not represented) connected to these second two pads CTB.

Figure 15:
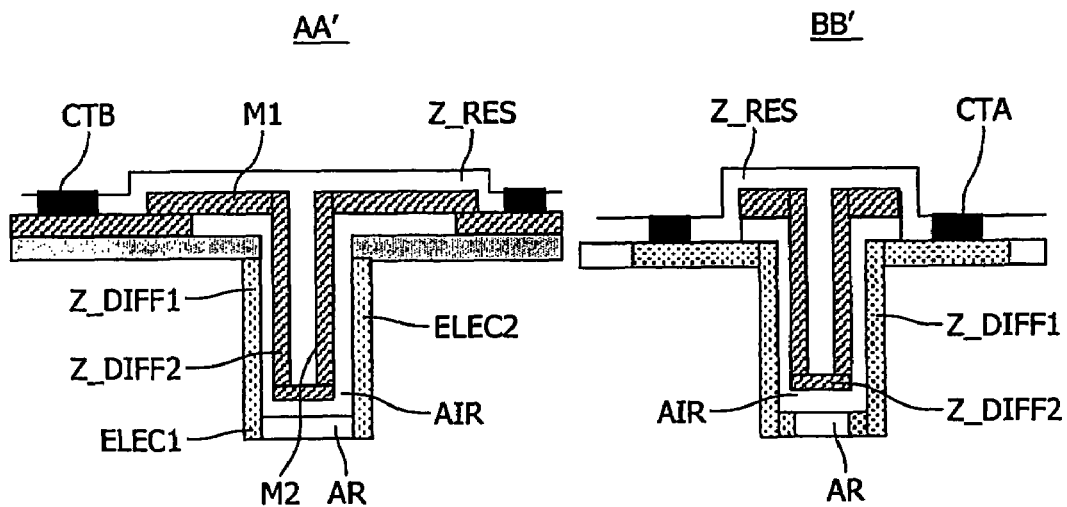
FIG. 15 depicts two sectional views of the semiconductor device of FIG. 13 with some added contacts.

In an additional step, an oxide layer Z_RES is added to the second doping zone Z_DIFF2 and to the whole substrate in order to protect the substrate of the semiconductor device SI. Thus, the hole TR is completely filled in and the second vertical part M2 of the element also includes a portion of the oxide layer Z_RES added as shown in FIG. 15. Of course, the first CTA and second CTB pads are defined in this layer Z_RES such that said layer leaves these contacts free to be connected.

Finally, as is commonly known, many metallization layers and oxide layers are added to the substrate of the semiconductor device SI, the final oxide layer being a protection layer, and metal pins are connected in order to connect the semiconductor to an electric housing. It is to be noted that the metallization layers are used to connect some pads to have access to some components of said semiconductor such as resistances, inductances and capacitances, and that the oxide layers are used as insulating layers between the metallization layers.

It is to be noted that the second doping zone Z_DIFF2 seals off the element of the resonator hermetically, so that said element is still free to move although there are some other layers added on the substrate.

It is to be noted that this method of manufacturing a resonator within a semiconductor device can be integrated in a method of manufacturing an integrated circuit that comprises elements other than the resonator.

Thus, a resonator with good quality factor Q is manufactured in a simple manner. Indeed, the distance between the two electrodes and the element of the resonator is very small, from 0.1 to 1 µm (that is the thickness of the oxide deposit M_OXI), which provides an efficient coupling without energy losses. The element vibrates mechanically at a precise frequency. Thus, the slight resistive losses associated with a pure vibration render possible a good resonance frequency. It is known that the Q factor is inversely proportional to the resistance.

Another advantage is that, while the resonator is being manufactured, the hermetical sealing of the resonator and thus of the substrate is obtained with no added process step, contrary to the prior art, where further complex process step is needed to seal off the substrate hermetically. Indeed, it is the second doping zone Z_DIFF2 that protects the element of the resonator from the other layers as it extends beyond the hole TR.

Moreover, no costly semiconductor is used as no SOI technology is needed in the invention. Thus, a deep hole can be dug into the substrate, contrary to the prior art, where the oxide insulating layer of the SOI technology prevents this.

A fourth advantage is that the two electrodes built are electrically protected against the substrate of the semiconductor device. Indeed, there is no leakage current as the electrodes have a low resistivity compared with the substrate, which is highly resistive. The current goes through the less resistive path, which is represented by the electrodes.

A fifth advantage is that the resonator is integrated in the semiconductor itself, which is better than having an external discrete resonator, as it permits size and cost reductions.

A sixth advantage is that this resonator occupies less room in the semiconductor than those which are based on a planar technology, such as bulk acoustic silicon resonator, where the resonator is put horizontally to the surface of the semiconductor and vibrates in a flexural mode.

Finally, another advantage is that the manufacture of the resonator takes place during an integrated silicon process, that is to say the semiconductor and the resonator are manufactured at the same time. Indeed, a semiconductor device comprises some capacitances, resistances and inductances. The capacitances are obtained with the trench TR and the first doping zone Z_DIFF1 as described above, the resistances are obtained with the second doping zone Z_DIFF2, and the inductances are obtained with the metallization layers. Additional diffusion layers may be added to manufacture active devices such as transistors.

Of course, the manufacture of the resonator may also be included in a silicon process used for an active semiconductor with transistors.

It is to be understood that the present invention is not limited to the aforementioned embodiments, and variations and modifications may be made without departing from the spirit and scope of the invention as defined in the appended claims.

Any reference sign in the following claims should not be construed as limiting the claim. It will be obvious that the use of the verb "to comprise" and its conjugations do not exclude the presence of any other steps or elements besides those defined in any claim. The article "a" or "an" preceding an element or step does not exclude the presence of a plurality of such elements or steps.

The invention claimed is:

1. A method of manufacturing a resonator within a semiconductor device, said semiconductor device comprising a substrate with a first and a second axes which are perpendicular, wherein said method comprises the steps of:
    etching a hole in the substrate;
    creating a first doping zone inside and around the hole for defining a first electrode;
    partitioning said first electrode into two electrodes;
    applying a delimited oxide deposit inside and around the hole according to a deposit pattern;
    defining a second doping zone fully covering the hole; and
    removing the oxide deposit in order to define an element forming the resonator configured to vibrate between the two electrodes,
    wherein the partition of the two electrodes is obtained by implanting a first dopant through a partitioning pattern.

2. The method of manufacturing a resonator within a semiconductor device as claimed in claim 1, wherein the implant partly covers the hole at its bottom and sides as well as the substrate surface adjoining said hole.

3. The method of manufacturing a resonator within a semiconductor device as claimed in claim 1, wherein the first dopant is Argon or Boron.

4. The method of manufacturing a resonator within a semiconductor device as claimed in claim 1, wherein said hole is a trench or a pore which is substantially perpendicular to the substrate surface.

5. The method of manufacturing a resonator within a semiconductor device as claimed in claim 1, wherein the substrate is of a high-ohmic type and the first doping zone is of a low-ohmic type.

6. The method of manufacturing a resonator within a semiconductor device as claimed in claim 1, wherein the deposit pattern extends along the second axis, the inside of said deposit pattern allowing the oxide to be settled inside the entire hole and at the substrate surface adjoining said hole and beyond.

7. The method of manufacturing a resonator within a semiconductor device as claimed in claim 1, wherein the second doping zone is obtained by means of a second doping pattern extending along the first axis of the semiconductor, the inside of said pattern allowing a second dopant to be settled totally inside the hole.

8. The method of manufacturing a resonator within a semiconductor device as claimed in claim 7, wherein the inside of said pattern permits a second dopant to cover totally the oxide deposit adjoining the hole and beyond.

9. The method of manufacturing a resonator within a semiconductor device as claimed in claim 1, wherein said method comprises a further step of adding first pads along the second axis on each side of the hole, said pads being in contact with the first doping zone.

10. The method of manufacturing a resonator within a semiconductor device as claimed in claim 1, wherein said method comprises a further step of adding second pads along the first axis on each side of the hole, said pads being in contact with the second doping zone.

11. The method of manufacturing a resonator within a semiconductor device as claimed in claim 1, wherein said semiconductor device comprises a substrate with a first definition zone where the resonator is built.

* * * * *